United States Patent [19]

Maeda

[11] Patent Number: 4,974,015
[45] Date of Patent: Nov. 27, 1990

[54] IMAGE RECORDING MEDIUM PRODUCING APPARATUS

[75] Inventor: Masataka Maeda, Konan, Japan

[73] Assignee: Brother Kogyo Kabushiki Kaisha, Aichi, Japan

[21] Appl. No.: 456,867

[22] Filed: Dec. 27, 1989

[30] Foreign Application Priority Data

Dec. 30, 1988 [JP] Japan ............................. 63-170659[U]

[51] Int. Cl.⁵ ...................... G03B 27/32; G03B 27/52; G03G 15/06
[52] U.S. Cl. ...................................... 355/27; 118/651; 354/301; 355/259; 430/138
[58] Field of Search ............... 355/245, 246, 254, 259, 355/27, 285; 354/301; 430/138; 118/651, 661, 60

[56] References Cited

U.S. PATENT DOCUMENTS

| 3,667,742 | 6/1972 | Kamola | 118/60 |
| 3,900,002 | 8/1975 | Stange | 355/259 X |
| 3,998,185 | 12/1976 | Weiler | 355/259 X |
| 3,999,515 | 12/1976 | Weiler | 118/651 |
| 4,114,261 | 9/1978 | Weiler | 355/265 X |
| 4,369,729 | 1/1983 | Shigenobu et al. | 118/60 |
| 4,398,497 | 8/1983 | Matkan | 118/661 |
| 4,541,705 | 9/1985 | Knechtel | 355/285 |
| 4,563,086 | 1/1986 | Knapp et al. | 355/246 |
| 4,825,256 | 4/1989 | Nakai et al. | 355/27 |
| 4,875,074 | 10/1989 | Sangyoji et al. | 355/27 |
| 4,920,374 | 4/1990 | Sangyoji et al. | 355/27 |
| 4,933,708 | 6/1990 | Asano et al. | 355/27 X |

FOREIGN PATENT DOCUMENTS

| 1169410 | 11/1969 | United Kingdom . |
| 1350946 | 12/1974 | United Kingdom . |
| 1378798 | 12/1974 | United Kingdom . |
| 1527168 | 10/1978 | United Kingdom . |
| 2055619 | 3/1981 | United Kingdom . |

Primary Examiner—Richard A. Wintercorn
Attorney, Agent, or Firm—Oliff & Berridge

[57] ABSTRACT

There is disclosed an image medium producing apparatus in a color image recording system which transfers an image on an exposed microcapsule sheet to a developer sheet as an image recording medium having a developer material applied onto a support member. The producing apparatus includes a developer material feeding roller, a conductive roller placed opposite to the feeding roller for conveying the support member and an oscillating device for oscillating at least one of both rollers in its axial direction. By oscillation of the roller, the developer material is applied onto the support member uniformly in spite of an uneven surface of the feeding roller or conglomeration of the developer material. As a result, the developer sheet having the developer material applied uniformly can be prevented from irregular coloring of an image.

19 Claims, 4 Drawing Sheets

IMAGE RECORDING MEDIUM PRODUCING APPARATUS

BACKGROUND OF THE INVENTION

The present invention relates to an apparatus for producing an image recording medium having a support member and a developer material coated thereon and, particularly, to an apparatus for applying a fine granular developer material onto a support member such as a plain paper.

In recent years, a color copier has been introduced wherein a microcapsule sheet is exposed to light through an original; the exposed microcapsule sheet is fed into a pressure-developing device together with a developer sheet (an image recording medium having a developer material applied onto a support member such as a plain paper); a latent image on the exposed microcapsule sheet is transferred to the developer sheet by the pressure-developing device; and the developer sheet is conveyed to a thermal fixing device so that a color image is formed on the developer sheet.

The developer sheet is made by applying a developer material, e.g., a material constituted with acid clay and a binder onto a support member. Apparatuses for applying the developer material to the support member are disclosed in U.S. patent application Ser. No. 07/253,614 filed on Oct. 5, 1988 and Ser. No. 07/437,516 filed on Nov. 16, 1989, assigned to the same assignee as the present invention. Each discloses an image recording medium producing apparatus of a type wherein the fine granular developer material is charged and thereby applied onto the support member.

Namely, as shown in FIG. 6, an image recording medium producing apparatus of the above-mentioned type is provided with a reservoir 50 for storing a fine granular developer material S, a feeding roller (a developer material feeding member) 52 rotating within reservoir 50 and supply roller 51 placed inside reservoir 50 and pressed against the roller 52. The feeding roller 52 and the supply roller 51 are rotated and cause the developer material S to be charged to a positive polarity by means of friction between the developer material S and rollers 51 and 52. The charged developer material S is applied to a peripheral surface of the feeding roller 52 and then is attracted to a conveying roller 53 placed opposite to the feeding roller 52.

The conveying roller 53 is supplied with negative voltage. A conveying belt 54 is extended between the conveying roller 53 and a pair of guide rollers 55. Thus, the conveying belt 54 is run by rotation of the conveying roller 53. A support member P, such as a plain paper for supporting the developer material S, is attracted to and conveyed by the conveying belt 54. Accordingly, an apparatus for conveying the support member P comprises the conveying roller 53, the conveying belt 54, and the guide rollers 55. The fine granular developer material S charged to a positive polarity is transferred and applied onto the support member P at a position where the peripheral surface of the feeding roller 52 is closest to the conveying roller 53, so that a layer m of the developer material is formed on the support member P.

Several problems exist in the image recording medium producing apparatus described above which produces uneven coating of support member P. Elements such as rollers and a belt are utilized as means for charging and feeding the fine granular developer material. The developer material is fed to a position opposite to the support member and is held on the developer material feeding member by static electricity caused by friction between the feeding member and the developer material. A layer of the developer material on the feeding member is formed with an uneven surface causing lines in a feeding direction of the feeding member because of either conglomeration of the fine granular developer material or an unevenly machined surface of the developer material feeding member, or both. Consequently, there remains in the proposed image recording medium producing apparatus a problem that the developer material cannot be applied uniformly to the support member. If the microcapsule sheet is put on the developer sheet having an uneven layer of the developer material and pressure-development is performed, an image is formed with irregular coloring.

SUMMARY OF THE INVENTION

Accordingly, it is an object of the present invention to provide an image recording medium producing apparatus capable of applying a fine granular developer material onto a support member in an uniform manner.

In order to accomplish the above-mentioned object, according to the present invention, there is provided an image recording medium producing apparatus for producing an image recording medium having a support member and a developer material coated thereon, the apparatus comprising: conveying means for conveying the support member in a first direction; feeding means for charging the developer material and feeding the charged developer material in a second direction to a position where the charged developer material is applied onto the support member by a force of static electricity; and means for imparting relative movement between the support member and the feeding means in a specific direction intersecting at least one of the first and second directions.

According to the present invention having the foregoing construction, the conveying means and the feeding means are relatively moved in the specific direction when the developer material is transferred from the feeding means to the support member on the conveying means by means of a force of static electricity. Therefore, the developer material is applied onto the support member in an uniform manner even if the developer material is held on the feeding means with linear fluctuations extending in the second direction, i.e., in a feeding direction of the feeding means. Further, in a case where the feeding means is moved relative to the conveying means in the specific direction, e.g., in a direction extending at a right angle with a feeding direction of the feeding means when the charged developer material is held on the feeding means, the linear fluctuations are leveled by the movement of the feeding means, thereby producing a smooth layer of the developer material held on the feeding means.

As described above in detail, since the developer material can be held on the feeding means in an uniform manner or since the transferred amount of the developer material can be rendered even on the support member when transferring the developer material from a position opposite the support member, it results in uniform application of developer material to the support member.

Therefore, if an exposed microcapsule sheet and a developer sheet having the developer material applied uniformly are pressure-developed in a superposed manner, the developer sheet is prevented from forming an image with irregular coloring.

BRIEF DESCRIPTION OF THE DRAWINGS

The above and other objects, features and advantages of the present invention will become more apparent from reading the following description of the preferred embodiments taken in connection with the accompanying drawings in which.

DETAILED DESCRIPTION OF THE PREFERRED EMBODIMENTS

Referring to the accompanying drawings, a first embodiment of an image recording medium producing apparatus according to the present invention will now be explained with reference to FIGS. 1-3.

Figure 1:
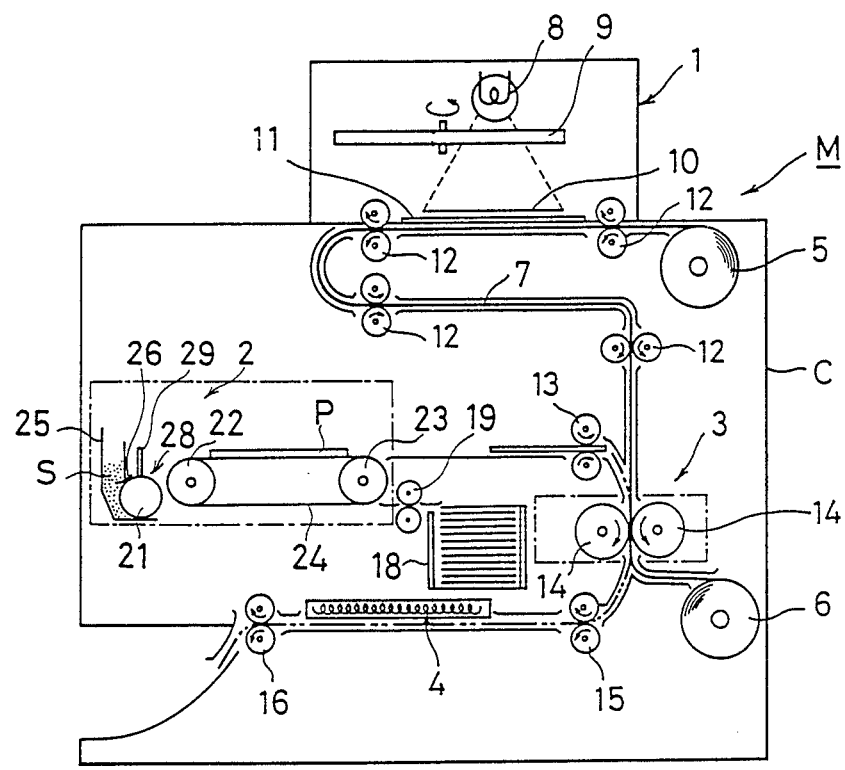
FIG. 1 is a plan view showing a conceptual construction of a color image recording system utilizing an embodiment of an image recording medium producing apparatus according to the present invention.

FIG. 1 shows a color image recording system M equipped with one embodiment of the image recording medium producing apparatus according to the present invention. This recording system M is provided with an exposing device 1 which exposes a microcapsule paper 7 (a photo and pressure sensitive recording paper running between a feed roll 5 and a take-up roll 6) to a light through an original 10. An image recording medium producing apparatus 2 is disposed about a central portion of a casing C of the recording system M, and, in the vicinity of the producing apparatus 2, a pressure-developing device 3 is placed.

In this pressure-developing device 3, the microcapsule paper 7 exposed by the exposing device 1 and a developer sheet having a fine granular developer material S applied onto a support member P (such as a plain paper) by the producing apparatus 2 are pressure-developed in a superposed manner, so that a color image of the microcapsule paper 7 is transferred to the developer sheet. After pressure-development by the device 3, the developer sheet is conveyed to a thermal fixing device 4 which performs a fixing operation of the developer sheet.

Under a halogen lamp 8 provided in the exposing device 1, a color filter 9 for three primary colors is rotatably supported. An original 10 is adapted to be set on a transparent support plate 11 which is placed under the color filter 9. A pair of guide rollers 12 are placed on each side of the support plate 11. The microcapsule paper 7 exposed at a lower portion of the exposing device 1 is transported into the pressure-developing device 3 through other pairs of guide rollers 12 placed further downstream in the travelling path from the exposing device 1.

The developer sheet, which has had the developer material S applied onto the support member P by the producing apparatus 2, is inserted between a pair of pressing rollers 14 of the pressure-developing device 3 by guide rollers 13 in a superposed manner with the microcapsule paper 7, and pressure-developing operation is performed by the pressing rollers 14.

After passing the pressure-developing device 3, the microcapsule paper 7 is wound around the take-up roll 6, while the developer sheet enters the thermal fixing device 4 through guide rollers 15 and exits through guide rollers 16 and is conveyed outside the casing C of the recording system M.

Figure 2:
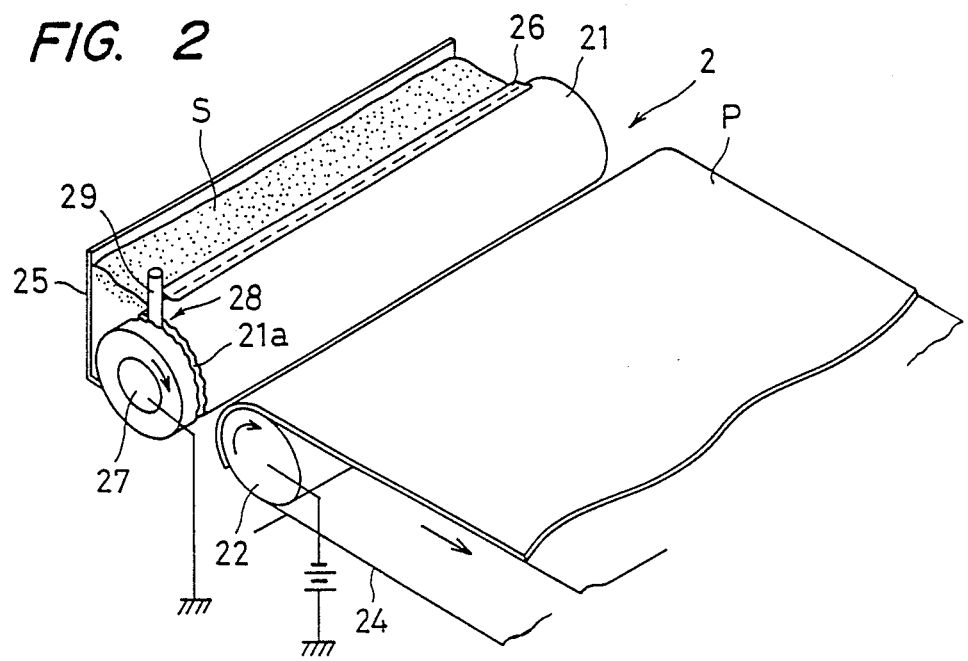
FIG. 2 is a perspective view showing a developer material feeding roller connected with a oscillating device and a conductive roller of the embodiment.
Figure 3:
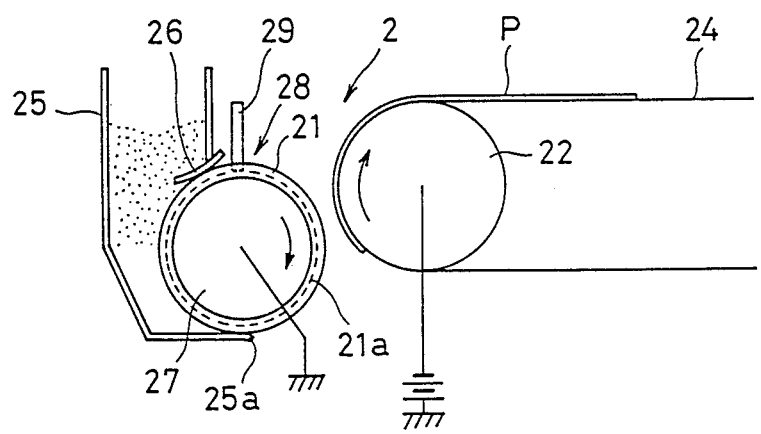
FIG. 3 is a side view of the feeding roller and the conductive roller shown in FIG. 2.

As FIGS. 2 and 3 show in detail, the image recording medium producing apparatus 2 is provided with a developer material feeding roller (a feeding roller) 21 and a conductive roller 22 disposed at a predetermined interval from the holding roller 21. Both rollers 21 and 22 are rotatable about two axes parallel to each other, respectively. The support member P, such as a plain paper, is conveyed through a gap between rollers 21 and 22 in such a manner as to keep in contact with a conductive conveying belt 24, which is extended between the conductive roller 22 and a belt roller 23. Thus, a support member conveying device comprises the rollers 22 and 23 and the conveying belt 24.

The feeding roller 21 is disposed on a side of a reservoir 25 which stores the fine granular developer material S. A blade 26 is placed in contact with the feeding roller 21. In addition, a metal core 27 is provided inside the feeding roller 21 and is grounded, while the conductive roller 22 is charged to a negative polarity.

In FIG. 2, the feeding roller 21 and the conductive roller 22 are adapted to be rotated in a clockwise direction, respectively. The feeding roller 21 is provided with an oscillating device 28 which oscillates the feeding roller 21 in an orthogonal direction to a direction of conveying the developer material S, i.e., in an axial direction of the feeding roller 21.

The oscillating device 28 comprises a wave-like groove 21a formed on an outer surface of the feeding roller 21 and a fixed pin 29, a lower end of which is inserted into the groove 21a. While the feeding roller 21 is rotated, the roller 21 is oscillated synchronously with rotation of the feeding roller 21 by means of the engagement of the wave-like groove 21a and the pin 29 fixed to a stationary member (not shown) within the casing C.

As shown in FIG. 1, a cassette 18 is piled with the support members P. Through an upper opening of the cassette 18, each support member P is sent out to the image recording medium producing apparatus 2 by a pair of supply rollers 19.

The operation of the image recording medium producing apparatus constructed as described above will now be explained.

When the developer material feeding roller 21 is rotated in a clockwise direction in FIGS. 2 and 3, the fine granular developer material S is drawn between the feeding roller 21 and the blade 26. By means of friction with the feeding roller 21, the developer material S is charged to one polarity, e.g., to a positive polarity, and thereby is held on the feeding roller 21. The held developer material S is leveled by the blade 26 and, in this state, is fed to a position opposite to the conductive roller 22.

While the developer material S is being fed, the feeding roller 21 is being oscillated or reciprocated in an orthogonal direction to a feeding direction of the developer material S by the oscillating device 28. One stroke of the oscillation occurs every time the feeding roller 21 is rotated at a predetermined angle. When the charged granular developer material S is drawn onto the holding roller 21, an uneven layer of the developer material S, which assumes lines in the feeding direction on the feeding roller 21, is rendered smooth by the oscillation of the feeding roller 21.

The feeding roller 21 is oscillated in the axial direction by the oscillating device 28 in a timed relation to its rotation, so that the oscillation movement smooths the uneven layer of the developer material S (rings of developer material S on the feeding roller 21 caused by: an uneven surface of the feeding roller 21 itself; an uneven surface of the blade 26; nonuniform pressure by the blade 26; conglomeration of the developer material; or other factors). Consequently, the developer material S is held with an uniform layer on the holding roller 21.

Further, since the conductive roller 22 is charged to a negative polarity, the granular developer material S, charged to a positive polarity, is transferred to the support member P along an electric flux from the metal core 27 to the conductive roller 22, and thereby is applied onto the support member P.

Even if the developer material S is held with an uneven layer on the feeding roller 21, the uneven layer can be made smooth because the feeding roller 21 is being oscillated relative to the conductive roller 22 in an orthogonal direction to the feeding direction of the developer material S, when the developer material S on the feeding roller 21 is transferred to the support member P by means of static electricity.

In the foregoing embodiment, the wave-like groove 21a and the fixed pin 29 are utilized as an oscillating device for the feeding roller 21. Alternatively, an oscillating device using a cam and a cam follower may be adopted. Further, a vibrator such as electrostrictive vibrator or magnetostrictive vibrator may be used as an oscillating device.

Figure 4:
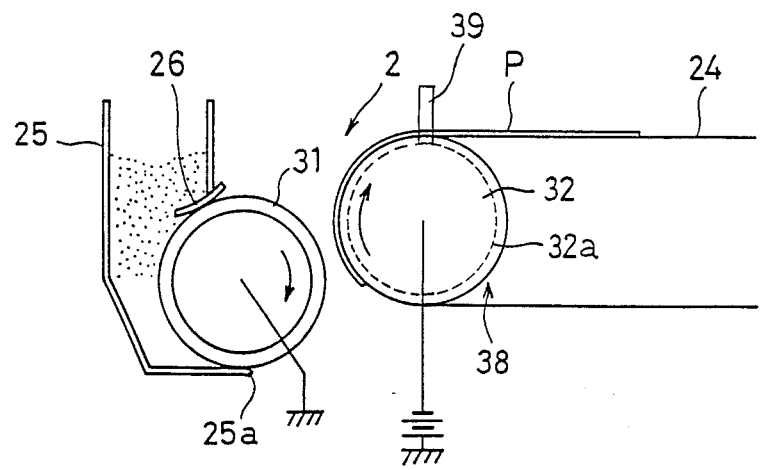
FIG. 4 is a side view of a developer material feeding roller and a conductive roller connected with a oscillating device of another embodiment of the present invention.

In addition, the foregoing embodiment is provided with the wave-like groove 21a and the fixed pin 29 on the feeding roller 21. Alternatively, as shown in FIG. 4, a wave-like groove 32a, formed like the groove 21a, and a fixed pin 39, engaged therewith, may be used as an oscillating device 38 to oscillate a conductive roller 32, (conveying the support member P) relative to a developer material feeding roller 31, which is allowed only a clockwise rotation in FIG. 4. Further, as shown in FIG. 5, both the feeding roller 21 and a conductive roller 42 may be provided with the oscillating device 28 and an oscillating device 48 having a wave-like groove 42a, formed like the groove 21a, on the roller 42 and a fixed pin 49 engaged therewith.

Figure 5:
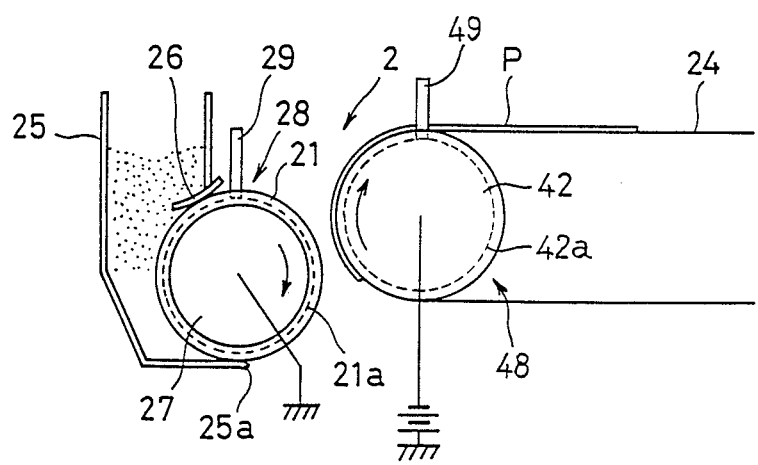
FIG. 5 is a side view of a developer material feeding roller and a conductive roller, which are connected with oscillating devices, respectively, in still another embodiment of the present invention.
Figure 6:
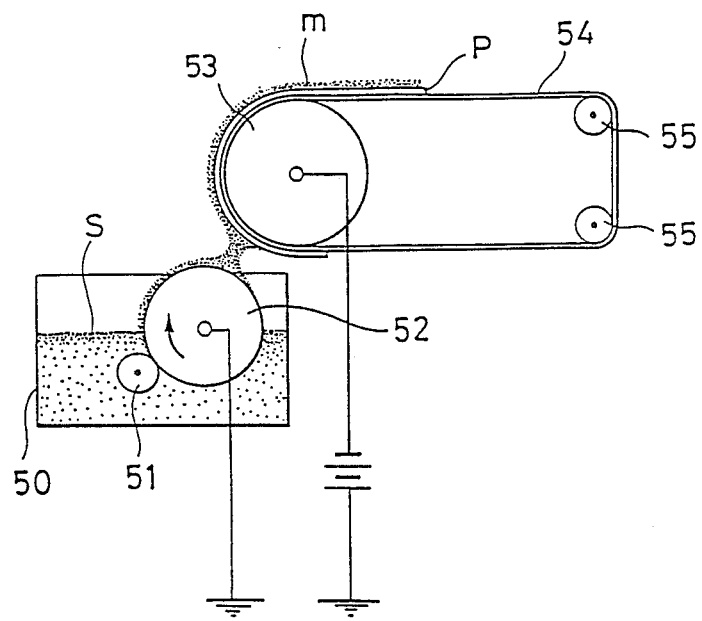
FIG. 6 illustrates a construction of a proposed image recording medium producing apparatus prior to the present invention.

In both embodiments shown in FIGS. 4 and 5, the support member P is oscillated, in an orthogonal direction to a direction of conveying the support member, so that an uneven layer of the developer material S can be made smooth when the developer material S is transferred to the support member P by a force of static electricity and the developer material S can be applied uniformly onto the support member P. In the embodiment shown in FIG. 5, since both the feeding roller 21 and the conductive roller 42 are oscillated, the developer material S can be applied onto the support member P more uniformly and rapidly.

It should be understood that the present invention is not limited to the above description, but is subject to modifications, alterations and equivalent arrangements within the scope of the appended claims. Thus, while only certain embodiments of the invention have been specifically described herein, it will be apparent from the above teachings that numerous modifications may be made thereto without departing from the spirit and scope of the invention.

What is claimed is:

1. An image recording medium producing apparatus for producing an image recording medium having a support member and a developer material coated thereon, said apparatus comprising:
   conveying means for conveying said support member in a first direction;
   feeding means for charging said developer material and feeding the charged developer material in a second direction to a position where the charged developer material is applied onto said support member by a force of static electricity; and
   means for imparting relative movement between said support member and said feeding means in a specific direction intersecting at least one of said first and second directions.

2. An image recording medium producing apparatus according to claim 1, wherein said imparting means oscillates at least one of said conveying means and said feeding means in said specific direction.

3. An image recording medium producing apparatus according to claim 1, wherein said first and second directions are parallel to each other and said specific direction is perpendicular to said first and second directions.

4. An image recording medium producing apparatus according to claim 1, wherein said feeding means is disposed so as to be in contact with said developer material stored in a reservoir and said imparting means oscillates said feeding means relative to said conveying means in said specific direction.

5. An image recording medium producing apparatus according to claim 1, wherein said feeding means includes a roller rotatable about an axis orthogonal to said second direction and said imparting means oscillates said roller in its axial direction.

6. An image recording medium producing apparatus according to claim 5, wherein said imparting means includes a wave-like groove formed on said roller and a fixed pin engaging with said groove.

7. In a color image recording system which transfers an image on an exposed microcapsule sheet to an image recording medium having a developer material coated on a support member, an image recording medium producing apparatus comprising:
   a reservoir for storing said developer material;
   a developer material feeding roller placed close to said reservoir so as to be in contact with said developer material in said reservoir, said feeding roller being rotatable about a first axis and capable of charging said developer material to a first polarity through friction with said developer material during rotation;
   means for conveying said support member, said conveying means including a conductive roller charged to a second polarity opposite to said first polarity, said conductive roller being rotatable about a second axis parallel to said first axis and disposed opposite to said feeding roller at a predetermined interval for transferring said developer material to said support member; and oscillating means for oscillating said developer material feeding roller relative to said conductive roller in a direction of said first axis.

8. An image recording medium producing apparatus according to claim 7, wherein said oscillating device includes a wave-like groove formed on an outer surface of said developer material feeding roller and a fixed pin engaging with said groove.

9. An image recording medium producing apparatus according to claim 7, further comprises a blade placed in contact with an outer surface of said developer material feeding roller and extending in a direction parallel to said first axis.

10. An image recording medium producing apparatus for producing an image recording medium having a support member and a developer material coated thereon, said apparatus comprising:

conveying means including a first roller rotatable to convey the support member;

a second roller rotatable about an axis parallel to a rotation axis of said first roller and disposed opposite to said first roller, an outer surface of said second roller being partly in contact with said developer material stored in a reservoir, said developer material held on said second roller being transferred to said support member on said first roller by a force of static electricity; and means for imparting relative movement between said first and second rollers in a direction parallel to a rotation axis of said first roller.

11. An image recording medium producing apparatus according to claim 10, wherein said imparting means imparts oscillation movement between said first and second rollers.

12. An image recording medium producing apparatus according to claim 11, wherein said imparting means oscillates said second roller relative to said first roller stationary in a direction of its rotation axis.

13. An image recording medium producing apparatus according to claim 11, wherein said imparting means oscillates said first roller relative to said second roller stationary in a direction of its rotation axis.

14. An image recording medium producing apparatus according to claim 11, wherein said imparting means oscillates both said first roller and said second roller.

15. An image recording medium producing apparatus according to claim 10, wherein said imparting means includes a wave-like groove formed on at least one of said first and second rollers and a fixed pin engaging with said groove.

16. An image recording medium producing apparatus according to claim 10, wherein said imparting means imparts said relative movement in a timed relation to rotation of at least one of said first and second rollers.

17. An image recording medium producing apparatus according to claim 12, wherein said imparting means oscillates said second roller in a timed relation to rotation of said second roller.

18. An image recording medium producing apparatus according to claim 13, wherein said imparting means oscillates said first roller in a timed relation to rotation of said first roller.

19. An image recording medium producing apparatus according to claim 14, wherein said imparting means oscillates both said first and second rollers in a timed relation to rotation of both rollers, respectively.

* * * * *